(12) United States Patent
Su et al.

(10) Patent No.: US 7,603,645 B2
(45) Date of Patent: Oct. 13, 2009

(54) CALIBRATION METHOD OF INSULATING WASHER IN CIRCUIT BOARD

(75) Inventors: Yu-Li Su, Taipei (TW); Chun-Yu Lai, Taipei (TW)

(73) Assignee: Inventec Corporation, Taipei (TW)

( * ) Notice: Subject to any disclaimer, the term of this patent is extended or adjusted under 35 U.S.C. 154(b) by 513 days.

(21) Appl. No.: 11/698,885

(22) Filed: Jan. 29, 2007

(65) Prior Publication Data

US 2008/0184175 A1 Jul. 31, 2008

(51) Int. Cl.
*G06F 17/50* (2006.01)
*H03K 17/693* (2006.01)
*H05K 1/11* (2006.01)
*H05K 7/12* (2006.01)

(52) U.S. Cl. ............... 716/15; 716/1; 716/2; 174/261; 174/265; 174/138 G

(58) Field of Classification Search ............ 716/1, 716/2, 15; 174/261, 265, 138 G
See application file for complete search history.

(56) References Cited

U.S. PATENT DOCUMENTS

| | | | | |
|---|---|---|---|---|
| 5,261,826 A | * | 11/1993 | Leeb et al. | 439/67 |
| 5,344,335 A | * | 9/1994 | Scholz et al. | 439/357 |
| 5,381,306 A | * | 1/1995 | Schumacher et al. | 361/792 |
| 5,655,931 A | * | 8/1997 | Perugini | 439/573 |
| 5,750,936 A | * | 5/1998 | Wheatley et al. | 174/138 G |
| 6,112,275 A | * | 8/2000 | Curry et al. | 711/100 |
| 6,573,876 B1 | * | 6/2003 | Maroko et al. | 343/906 |
| 7,361,593 B2 | * | 4/2008 | Freeman et al. | 438/675 |
| 2005/0258523 A1 | * | 11/2005 | Su et al. | 257/675 |
| 2008/0060837 A1 | * | 3/2008 | Matsui | 174/261 |
| 2008/0107016 A1 | * | 5/2008 | Tang | 370/217 |

FOREIGN PATENT DOCUMENTS

TW 200612803 10/2004

* cited by examiner

*Primary Examiner*—Helen Rossoshek
(74) *Attorney, Agent, or Firm*—Rabin & Berdo, P.C.

(57) ABSTRACT

A calibration method of insulating washer in a circuit board is provided, which includes steps of (a) establishing an equivalent circuit model corresponding to a metal via; (b) depicting an electric characteristic curve corresponding to the model; (c) calculating a capacitance and an inductance equation corresponding to the curve; (d) substituting parameter values of the equivalent circuit model, capacitance equation, and inductance equation into a characteristic impedance expression for being calculated, so as to obtain a first radius length value of an insulating washer for the metal via; (e) making a temporary insulating washer by employing the value; (f) reestablishing an equivalent circuit model corresponding to the metal via according to the temporary insulating washer; repeating Steps (b), (c), (d), (e), and (f); and when the first radius length value is converged into a fixed value, determining the fixed value as an optimum value for designing the insulating washer.

6 Claims, 7 Drawing Sheets

CALIBRATION METHOD OF INSULATING WASHER IN CIRCUIT BOARD

BACKGROUND OF THE INVENTION

1. Field of Invention

The present invention relates to an impedance matching method of a signal transmission path in a circuit board, and more particularly, to a calibration method of insulating washer in a circuit board.

2. Related Art

In the current design of a high-speed signal circuit board, electric signals in different signal layers are connected through a metal via, and the impedance characteristic achieved by a geometric structure of the circuit board usually does not match with the impedance characteristic of the signal lines for the signal layer. As a result, the signal reflection phenomenon easily occurs when a signal passes through the metal via, thereby degrading the signal transmission quality.

With reference to Taiwan Patent Publication No. 200612803, it discloses a double-layer printed circuit board (PCB) capable of controlling impedance and a method thereof. The double-layer PCB includes a dielectric layer and a plurality of high-speed signal transmission lines disposed on the dielectric layer, wherein ground layers are further disposed on the dielectric layer adjacent to each of the high-speed signal transmission lines. When the double-layer PCB is employed, a two-dimensional sectional view of the double-layer PCB is inputted into simulation software that calculates the characteristic impedance value of the high speed signal transmission lines and then compares it with a standard impedance value. Then, after the parameter values of the high-speed signal transmission lines and the relative position of the high-speed signal transmission lines and the ground layer have been adjusted for many times, the two-dimensional graph has been inputted for many times, and the simulation software has performed the calculation for many times, an ideal characteristic impedance value is obtained.

Although the above patent application has disclosed a method for controlling the impedance of a double-layer PCB, but through the method, the impedance of the multi-layer PCB with the metal via cannot be controlled. Therefore, the application of the aforementioned method is limited.

Therefore, how to provide a calibration method of insulating washer in a circuit board has become an urgent issue for being solved by researchers, so as to match with the impedance of the signal transmission lines in a multi-layer PCB.

SUMMARY OF THE INVENTION

In view of the aforementioned problem, the present invention is directed to providing a calibration method of insulating washer in a circuit board, so as to solve the problem that the impedance of a multi-layer PCB is discontinuous due to a metal via, and to enhance the signal transmission quality.

The calibration method of insulating washer in a circuit board provided by the present invention comprises the following steps: (a) establishing an equivalent circuit model corresponding to a metal via; (b) depicting an electric characteristic curve corresponding to the equivalent circuit model; (c) calculating a capacitance equation and an inductance equation corresponding to the electric characteristic curve; (d) substituting parameter values (an inductance value and a capacitance value), the capacitance equation, and the inductance equation of the equivalent circuit model into a characteristic impedance expression for being calculated, so as to obtain a first radius length value of an insulating washer for the metal via; (e) making a temporary insulating washer by employing the first radius length value; (f) reestablishing an equivalent circuit model corresponding to the metal via according to the temporary insulating washer; repeating Steps (b), (c), (d), (e), and (f); and when the first radius length value is converged to be a fixed value, determining the fixed value as an optimum value for designing the insulating washer.

Through the calibration method of insulating washer in the circuit board, an elliptical insulating washer is disposed around the metal via to adjust the impedance value of the signal lines adjacent to the area of the insulating washer. Furthermore, the optimum value for designing the insulating washer is obtained after repeatedly calculating through the characteristic impedance expression, so as to make the whole line impedance be matched. In this manner, the signal reflection phenomenon is reduced, and thereby further enhancing the signal transmission quality.

The features and practice of the preferred embodiments of the present invention will be illustrated below in detail with reference to the drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

Figure 1:
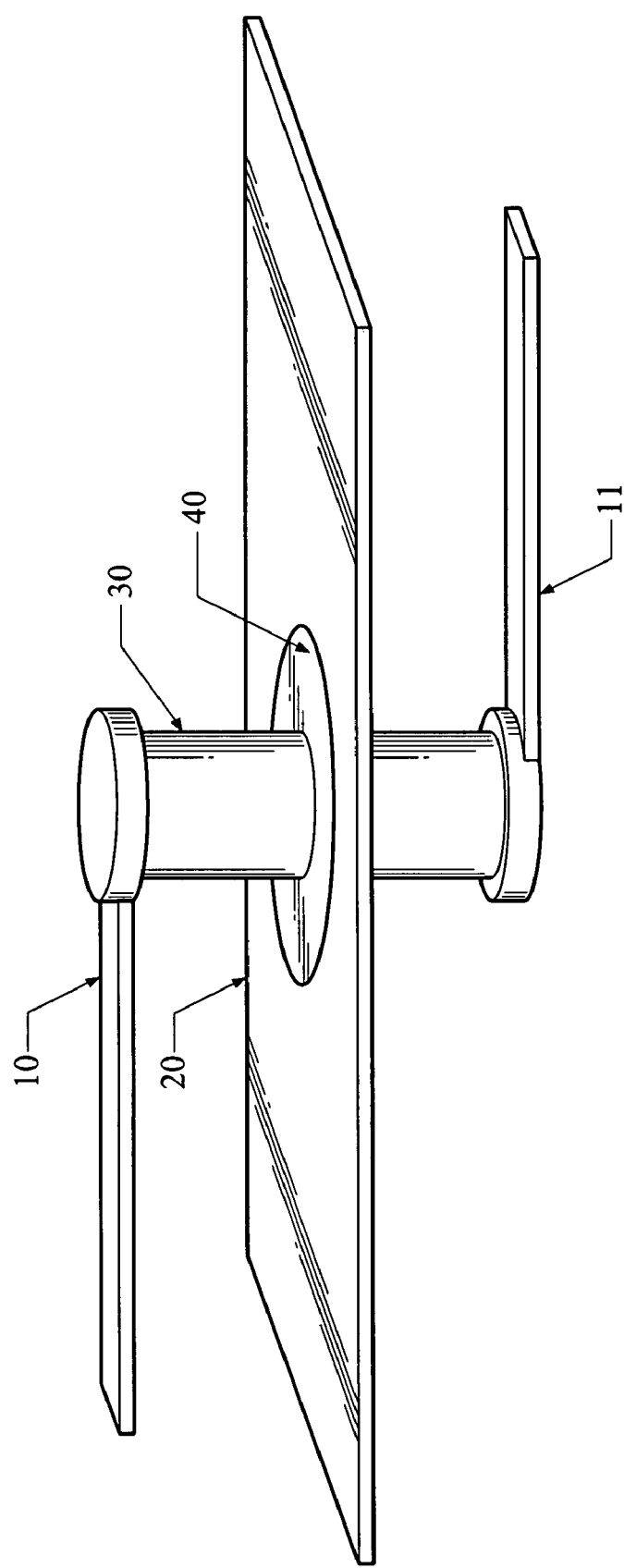
FIG. 1 is a schematic isometric view of an embodiment of the present invention.

Referring to FIG. 1, it is a schematic isometric view of an embodiment of the present invention. As shown in FIG. 1, a printed circuit board (PCB) of the present invention includes a first signal line 10, a second signal line 11, a power source/ground layer 20, a metal via 30, and an insulating washer 40.

The first signal line 10 is disposed above the power source/ground layer 20 and it is made of a conductive material (such as Cu, Ag) to be used as a signal transmission medium.

The second signal line 11 is disposed under the power source/ground layer 20 and it is made of a conductive material (such as Cu and Ag) to be used as a signal transmission medium.

The power source/ground layer 20 is disposed between the first signal line 10 and the second signal line 11 to be used as a transmission medium for a power source signal and a ground signal.

The metal via 30 penetrates the power source/ground layer 20 and it is made of a conductive material (such as Cu and Ag) to be used to connect the first signal line 10 with the second signal line 11.

The insulating washer 40 is disposed around the metal via 30 and it is made of an insulating material, and through changing the geometric structure of the insulating washer 40, impedance values of the metal via 30, the first signal line 10, and the second signal line 11 are adjusted, and in this embodiment of the present invention, the insulating washer 40 is preferably elliptical-shaped.

Figure 2:
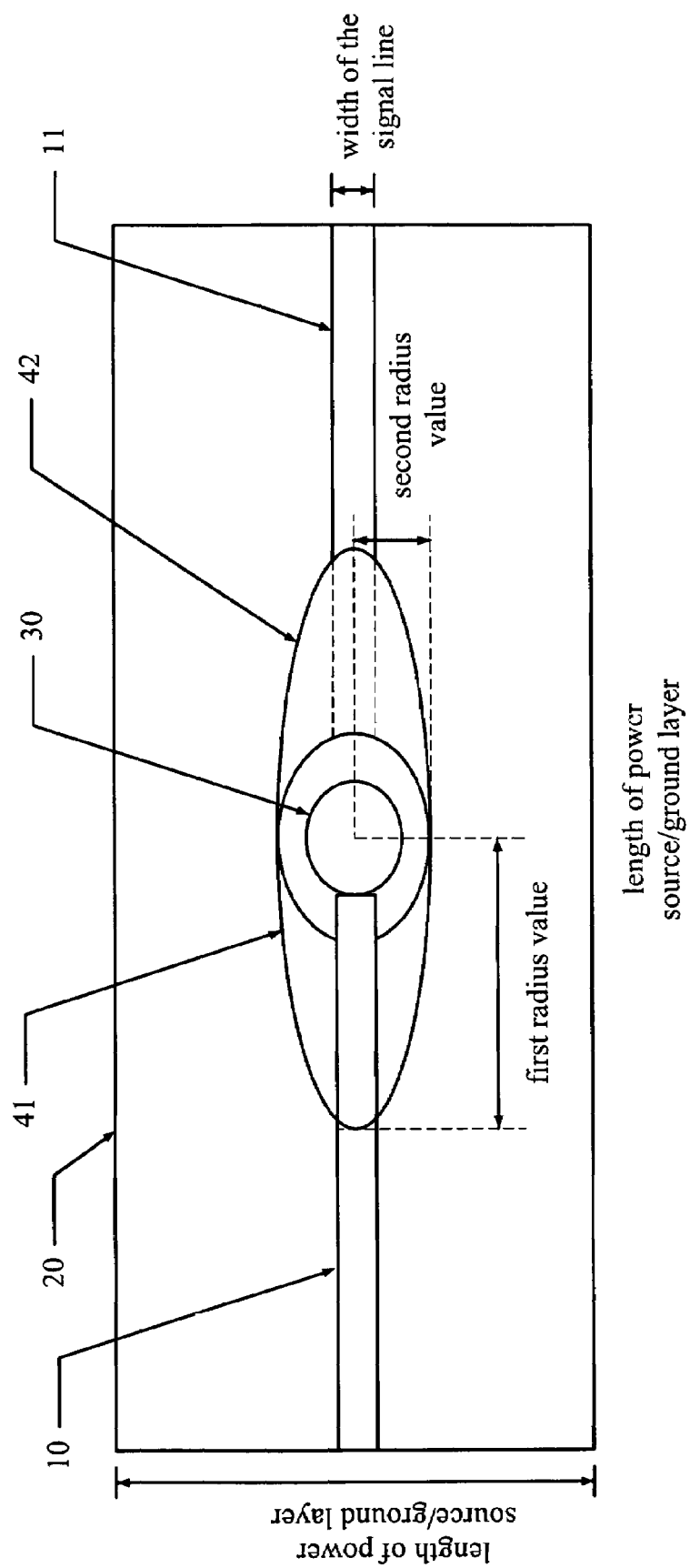
FIG. 2 is a schematic top view of an embodiment of the present invention.

Referring to FIG. 2, it is a schematic top view of the embodiment of the present invention. As shown in FIG. 2, firstly, a temporary insulating washer 41 is disposed around the metal via 30, and an impedance matching insulating washer 42 is obtained through the calibration method of insulating washer in FIG. 3, wherein the first radius value (i.e., transverse axis) of the impedance matching insulating washer 42 is larger than the first radius value of the temporary insulating washer 41, and the second radius value (i.e., vertical axis) of the impedance matching insulating washer 42 is equal to the second radius value of the temporary insulating washer 41. In this embodiment of the present invention, the relevant sizes of the circuit board are listed as follows: the length of the power source/ground layer 20 is 1600 mil, the width of the power source/ground layer 20 is 440 mil, and the widths of the first signal line and the second signal line are 44 mil.

Figure 3:
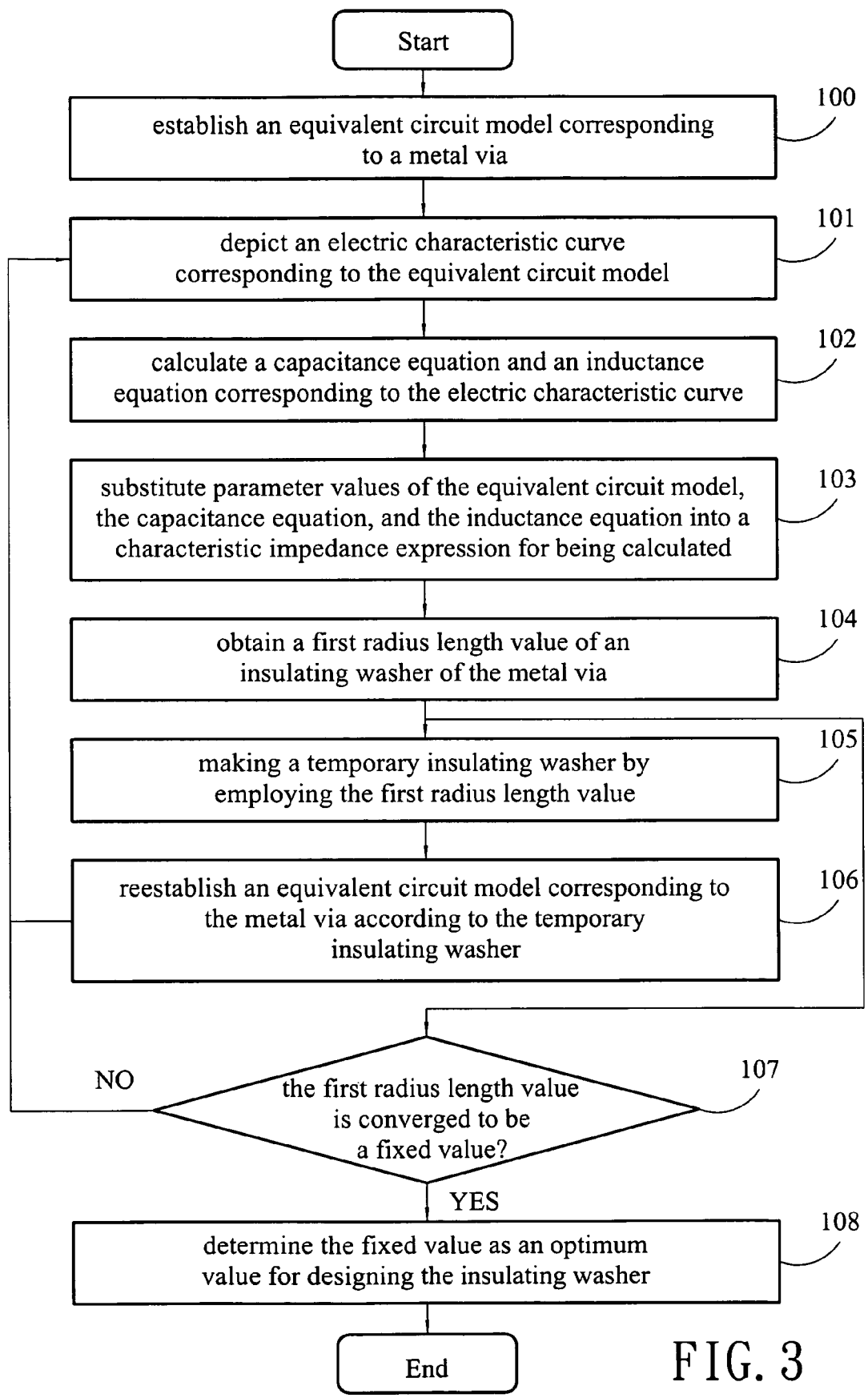
FIG. 3 is a flow chart of a calibration method of insulating washer according to an embodiment of the present invention.

Next, referring to FIG. 3, it is a flow chart of a calibration method of insulating washer according to an embodiment of the present invention. As shown in FIG. 3, the calibration method of insulating washer provided by the present invention includes the following steps.

Figure 4B:
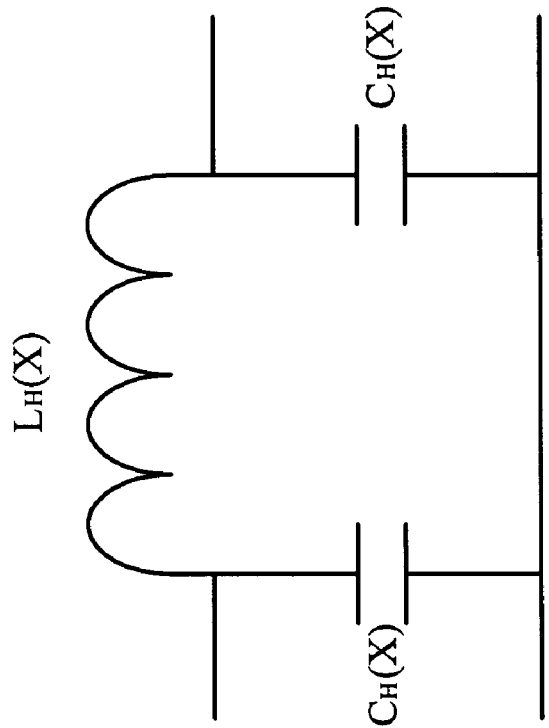
FIG. 4B is a schematic view of the equivalent circuit model represented by functions according to an embodiment of the present invention.
Figure 4A:
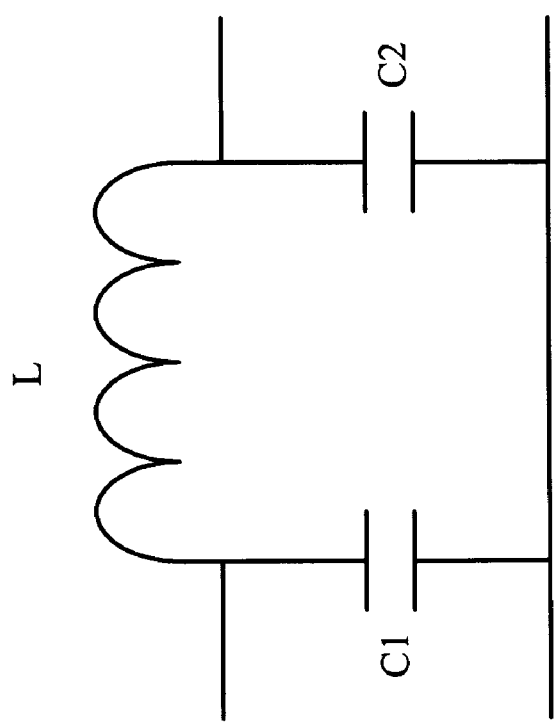
FIG. 4A is a schematic view of an equivalent circuit model according to an embodiment of the present invention.

Firstly, an equivalent circuit model corresponding to a metal via is established (Step 100). The corresponding equivalent circuit model is established according to the structure in FIG. 1, as shown in FIG. 4A, wherein the equivalent circuit model includes an inductor L, a first capacitor C1, and a second capacitor C2. FIG. 4B shows the equivalent circuit model represented by functions. Then, an electric characteristic curve corresponding to the equivalent circuit model is depicted (Step 101), and a capacitance characteristic curve (as shown in FIG. 5A) and an inductance characteristic curve (as shown in FIG. 5B) are depicted according to the equivalent circuit model in FIG. 4B.

Figure 5B:
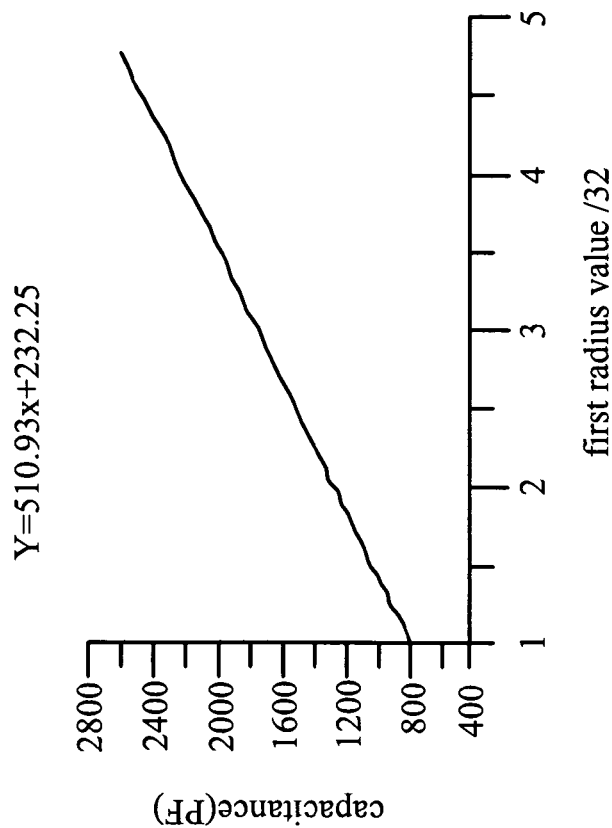
FIG. 5B is a schematic curve of the inductance characteristic according to an embodiment of the present invention.
Figure 5A:
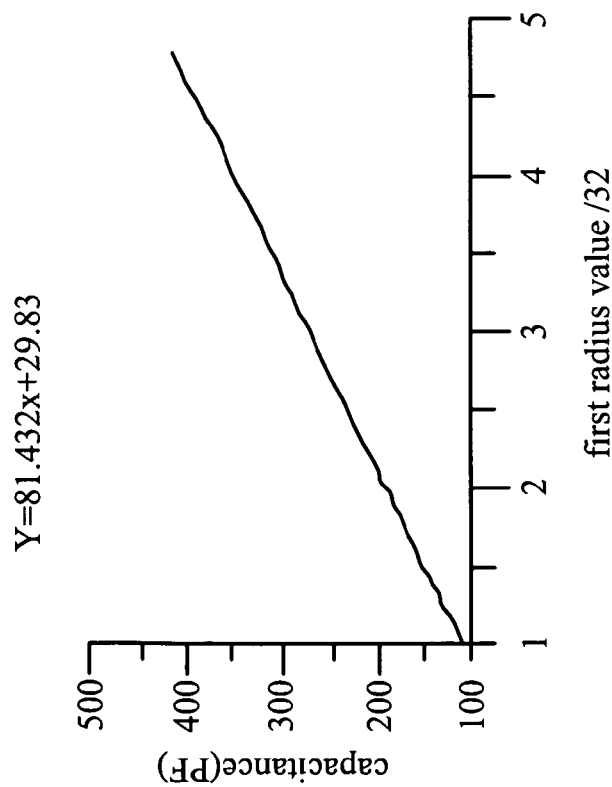
FIG. 5A is a schematic curve of the capacitance characteristic according to an embodiment of the present invention.

Then, the capacitance equation and the inductance equation corresponding to the electric characteristic curve are calculated (Step 102), wherein, in this embodiment of the present invention, the capacitance equation calculated according to the capacitance characteristic curve (as shown in FIG. 5A) is Y=81.432x+29.83, and the inductance equation calculated according to the inductance characteristic curve (as shown in FIG. 5B) is Y=510.93x+232.25.

After that, the parameter values (i.e., the value of the inductor L, the value of the first capacitor C1, and the value of the second capacitor C2) of the equivalent circuit model, the capacitance equation (i.e., Y=81.432x+29.83), and the inductance equation (i.e., Y=510.93x+232.25) are substituted into a characteristic impedance expression for being calculated (Step 103), wherein the characteristic impedance expression is shown as follows, $$Z_O = \sqrt{\frac{L + L_H(x)}{C1 + C2 + 2 * C_H(x)}},$$

wherein Zo indicates the characteristic impedance value (the impedance value to be designed, which thus is known) of the signal line, L indicates the value of the inductor, $L_H(x)$ indicates the inductance equation, C1 indicates the value of the first capacitor, C2 indicates the value of the second capacitor, $C_H(x)$ indicates the capacitance equation, and x indicates the first radius value.

After the calculation process through the characteristic impedance expression, the first radius length value of the insulating washer for the metal via is obtained (Step 104) and it is served as the length of the transverse axis for the temporary insulating washer (Step 105). At this time, since the sizes of the insulating washer in the circuit board have been modified into the sizes of the temporary insulating washer, the inductance value and the capacitance value in the equivalent circuit model are also changed accordingly. Subsequently, an equivalent circuit model corresponding to the metal via is reestablished according to the temporary insulating washer (Step 106), and then, it returns to Step 101, the electric characteristic curve corresponding to the equivalent circuit model is depicted again, the capacitance equation and the inductance equation corresponding to the electric characteristic curve are calculated again, the parameter values of the equivalent circuit model, the capacitance equation, and the inductance equation are substituted into the characteristic impedance expression for being calculated again, and another first radius length value of the insulating washer for the metal via is obtained again, and so forth. Therefore, a plurality of first radius length values is obtained after repeated calculation. Finally, it is determined whether the first radius length value is converged to a fixed value or not (Step 107). If the first radius length value is converged to a fixed value, the fixed value is determined to be an optimum value for designing the insulating washer (Step 108). If the first radius length value is not converged to a fixed value, it returns to Step 101. Each step in this embodiment of the present invention employs a high frequency structure simulator (HFSS) to perform simulation calculation.

Figure 6A:
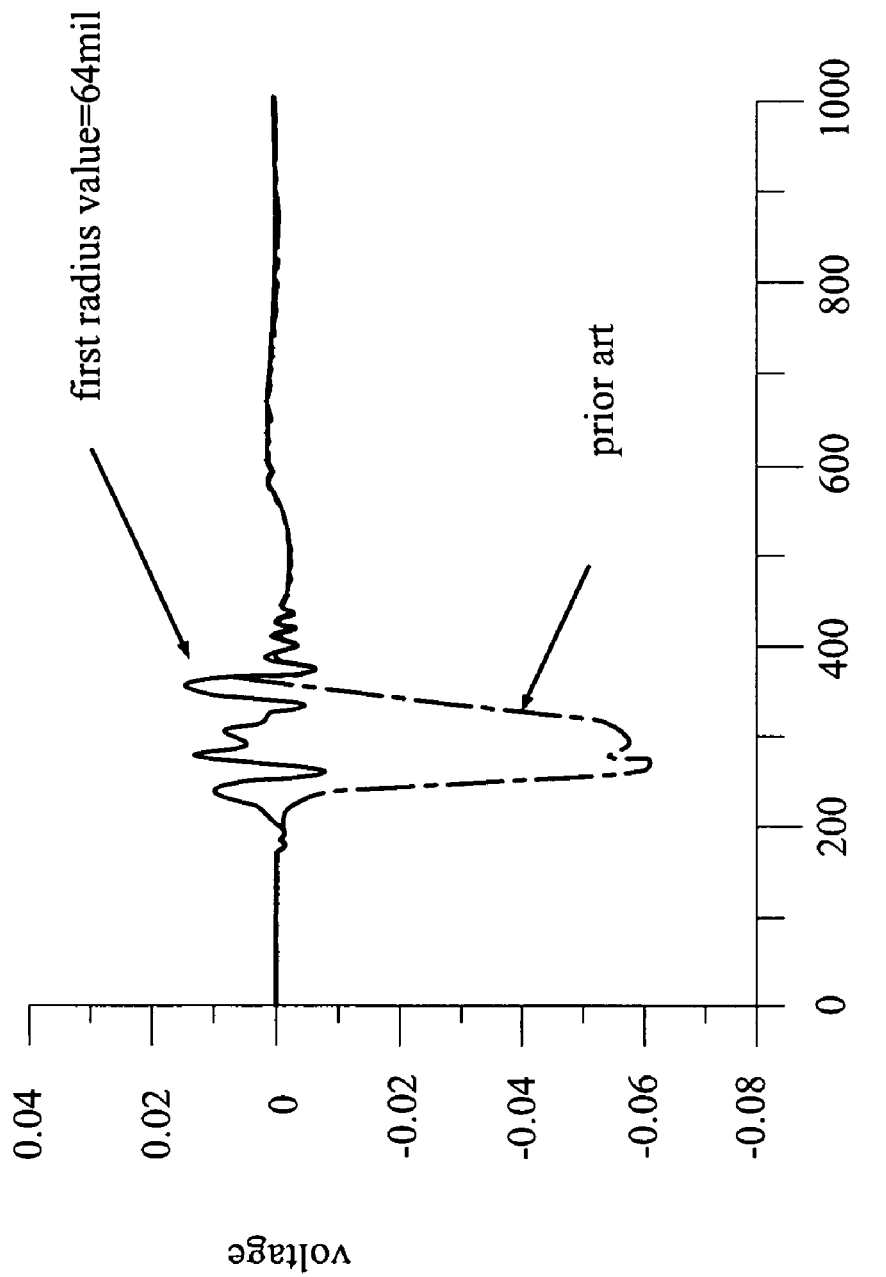
FIG. 6A is a schematic simulation diagram of a signal reflection waveform (time domain) according to an embodiment of the present invention.
Figure 6B:
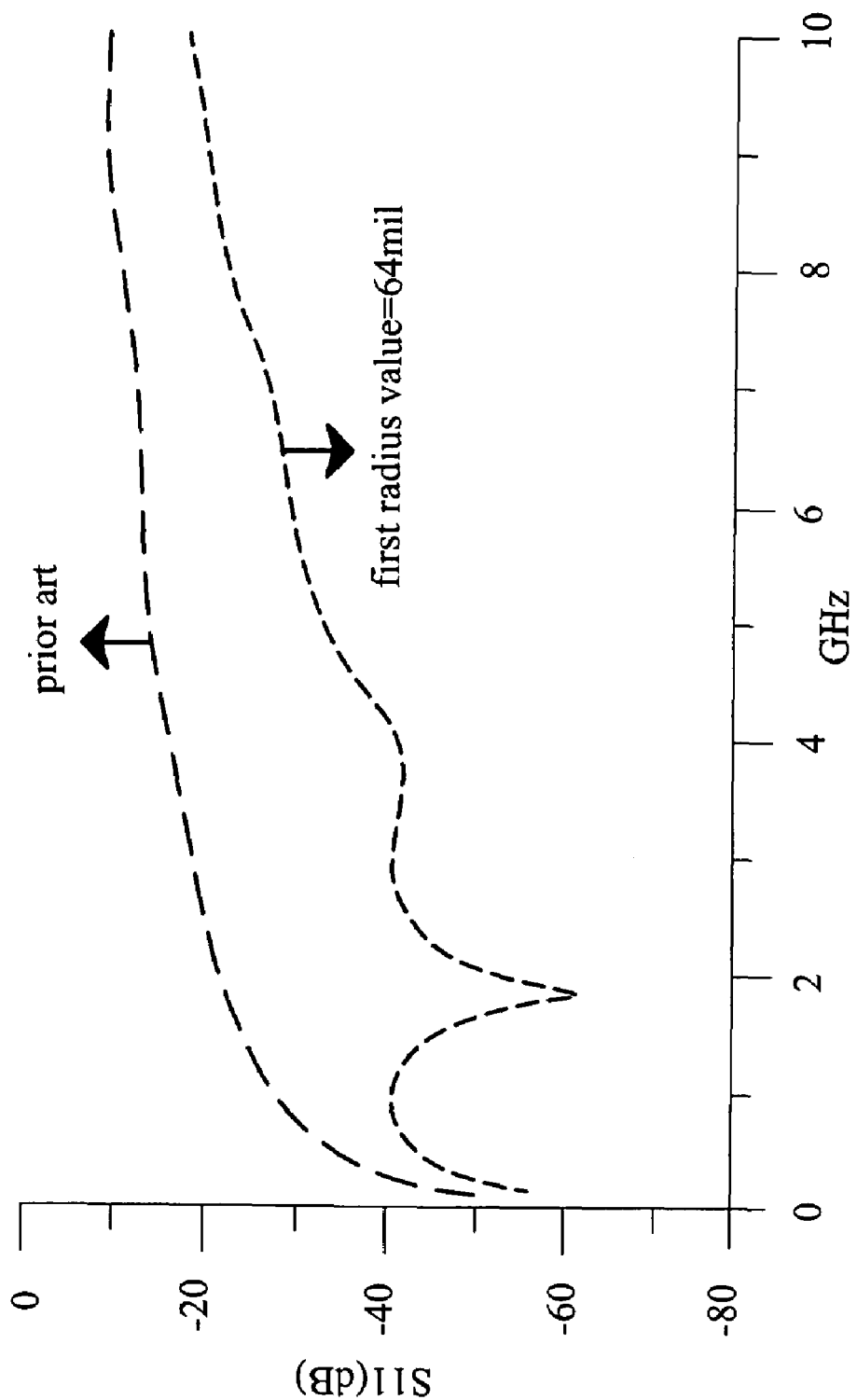
FIG. 6B is a schematic simulation diagram of a signal reflection waveform (frequency domain) according to an embodiment of the present invention.

Referring to FIG. 6, it is a schematic simulation diagram of a signal reflection waveform (time domain) according to an embodiment of the present invention. As shown in FIG. 6A, it can be found that when the first radius value is 64 mil, the oscillation phenomenon of a signal passing through the metal via 30 is significantly reduced compared with the prior art. Next, referring to FIG. 6B, it is a schematic simulation diagram of a signal reflection waveform (frequency domain) according to an embodiment of the present invention. As shown in FIG. 6B, it can be found that when the first radius value is 64 mil, the reflection loss (S11) of the signal passing through the area of the metal via 30 is significantly reduced compared with the prior art.

In the calibration method of insulating washer in the circuit board, an elliptical insulating washer is disposed around the metal via to adjust the impedance value of the signal line adjacent to the area of the insulating washer. Furthermore, the optimum value for designing the insulating washer is obtained after repeatedly calculating through the characteristic impedance expression, so as to make the whole line impedance be matched. In this manner, the signal reflection phenomenon is reduced, and thereby signal transmission quality is further enhanced. Additionally, the quality degrading phenomenon of the signal passing through the metal via is significantly reduced, the number of the metal vias that can be used when designing the signal transmission path is increased, and thus the freedom for circuit design is increased and the number of layers for the circuit board and the manufacturing cost are reduced.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A calibration method of insulating washer in a circuit board, wherein an insulating washer is disposed around a metal via, the calibration method comprising the steps of:
   (a) establishing an equivalent circuit model corresponding to the metal via, and storing the same in a computer;
   (b) with computer software run on the computer;
      (i) depicting an electric characteristic curve corresponding to the equivalent circuit model;
      (ii) calculating a capacitance equation and an inductance equation corresponding to the electric characteristic curve;
      (iii) substituting parameter values of the equivalent circuit model, the capacitance equation, and the inductance equation into a characteristic impedance expression for being calculated, so as to obtain a first radius length value of the insulating washer for the metal via;
      (iv) making a temporary insulating washer by employing the first radius length value;
      (v) reestablishing an equivalent circuit model corresponding to the metal via according to the temporary insulating washer;
   (c) repeating steps (i), (ii), (iii), (iv), and (v) until the first radius length value is converged to be a fixed value; and
   (d) when the first radius length value is converged to the fixed value in step (c), determining the fixed value as an optimum value for designing the insulating washer.

2. The calibration method of insulating washer in a circuit board as claimed in claim 1, wherein the equivalent circuit model comprises an inductor, a first capacitor, and a second capacitor.

3. The calibration method of insulating washer in a circuit board as claimed in claim 2, wherein the electric characteristic curve comprises a capacitance characteristic curve and an inductance characteristic curve.

4. The calibration method of insulating washer in a circuit board as claimed in claim 3, the characteristic impedance expression employs following equation:

$$Zo = \sqrt{\frac{L + L_H(x)}{C1 + C2 + 2*C_H(x)}},$$

wherein Zo indicates a characteristic impedance value of a signal line, L indicates the inductance, $L_H(x)$ indicates the inductance equation, C1 indicates the first capacitance, C2 indicates the second capacitance, $C_H(x)$ indicates the capacitance equation, and x indicates the first radius length value.

5. The calibration method of insulating washer in a circuit board as claimed in claim 4, wherein the parameter values include value of the inductance, value of the first capacitance, and value of the second capacitance.

6. The calibration method of insulating washer in a circuit board as claimed in claim 1, wherein the optimum value serves as a radius value of a transverse axis for an elliptical insulating washer.

* * * * *